Sept. 13, 1966 M. E. SEKELY 3,272,989
INTEGRATED ELECTRICAL CIRCUIT
Filed Dec. 17, 1963 2 Sheets-Sheet 1

INVENTOR.
MICHAEL E. SEKELY
BY Eugene M. Whitmore
Attorney

INVENTOR.
MICHAEL E. SEKELY
BY Eugene M. Whitacre
Attorney

United States Patent Office 3,272,989
Patented Sept. 13, 1966

3,272,989

INTEGRATED ELECTRICAL CIRCUIT

Michael E. Sekely, Belle Mead, N.J., assignor to Radio Corporation of America, a corporation of Delaware Filed Dec. 17, 1963, Ser. No. 331,271
7 Claims. (Cl. 307—88.5)

This invention relates in general to semiconductor circuits, and more in particular to electrical circuits wherein various components of the circuit are formed as an integral part of a unitary block of semiconductor material.

As it is well known, in many electrical circuit applications, such as in oscillators or frequency selective amplifiers, it is desirable to use inductors as a portion of the frequency selection network. One of the major problems in integrating electronic circuits, is that of providing suitable inductors for use with the rest of the elements of the circuit. At the present state of the art, active devices, resistors and capacitors can be formed in extremely minute chips of semiconductor material. However, inductors, per se, are not susceptible of being formed in the same chip of semiconductor material by methods which are compatible with the production of the other elements of the circuit, such as resistors, capacitors, diodes and transistors for example. Furthermore, it is difficult, by known methods, to manufacture inductances of substantial inductance value and the desired miniaturized size.

Accordingly, it is an object of this invention to provide an electronic inductor, compatible with circuit element integrating techniques.

It is another object of this invention to provide an electrical circuit, wherein the various components of the circuit are formed as an integral part of a unitary block of semiconductor material, having an inductive impedance.

An electrical circuit embodying the invention includes a transistor having input, common and control electrodes formed on a substrate of semiconductor material. A pair of input terminals is provided for applying an input signal voltage. A phase-shifting network, which includes resistive circuit means and capacitive circuit means, is formed on the substrate and between the pair of input terminals to derive a voltage which is out of phase with the input signal voltage. Circuit means respectively couple the input signal voltage between the input and common electrodes and the voltage derived from the phase shifting network between the control and common electrodes of the transistor, whereby the net current flowing into the input terminals lags the input signal voltage.

The novel features which are considered characteristic of the invention are set forth with particularly in the appended claims. The invention itself, however, both as to its organization and method of operation as well as additional objects and advantages thereof will best be understood from the accompanying drawings in which:

Figure 1:
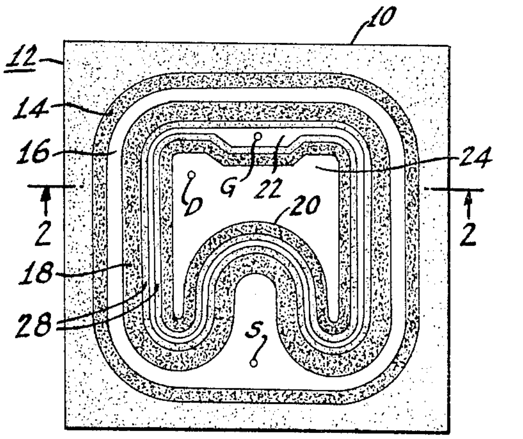
FIGURE 1 is a diagrammatic view of a field-effect transistor suitable for use in circuits embodying the invention.

Referring now to the drawings and particularly to FIGURE 1, a field-effect transistor 10 which may be used with circuits embodying the invention includes a body 12 of semiconductor material. The body 12 may be either a single crystal or polycrystalline and may be of any of the semiconductor materials used to prepare transistors in the semiconductor art. For example, the body 12 may be nearly intrinsic silicon, such as for example, lightly doped P-type silicon of 100 ohm-cm. material.

In the manufacture of the device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silcon wafer as viewed on FIGURE 1. The deposited silicon dioxide is left over those areas where the source and drain regions are to be formed.

Figure 2:
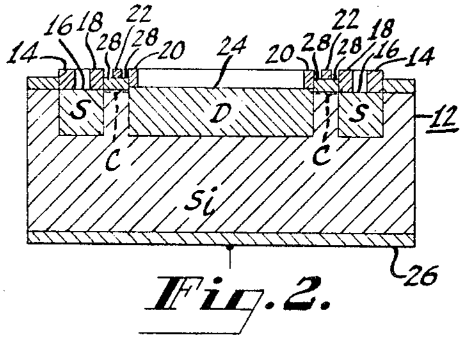
FIGURE 2 is a cross-section view taken along section line 2—2 of FIGURE 1.

The body 12 is then heated in a suitable atmosphere, such as in water vapor, so that exposed silicon areas are oxidized to form grown silicon dioxide layers indicated by the lightly stippled areas of FIGURE 1. During the heating process, impurities from the deposited silicon dioxide layer diffuse into the silicon body 12 to form the source and drain regions. FIGURE 2, which is a cross-sectional view taken along section line 2—2 of FIGURE 1, shows the source-drain regions labeled S and D respectively.

By means of another photo-resist and acid etching or like step, the depostited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the lightly stippled area between the outside boundary and the first dark zone 14 is grown silicon dioxide. The white area 16 is the metal electrode corresponding to the source electrode. Dark or more heavily stippled zones 14 and 18 are deposited silicon dioxide zones overlying a portion of the diffused source region, and the dark zone 20 is a deposited silicon dioxide zone overlying a portion of the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2.

The silicon wafer is mounted on a conductive base or header 26 as shown in FIGURE 2. The layer of grown silicon dioxide 28 on which the gate electrode 22 is mounted, overlies an inversion layer or conducting channel C connecting the source and drain regions. If desired, the gate electrode may overlap the deposited silicon dioxide layer 18.

Figure 3:
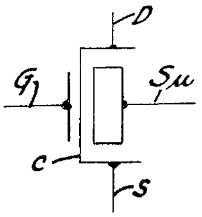
FIGURE 3 is a symbolic representation of an insulated-gate field-effect transistor.

FIGURE 3 is a symbolic representation of the insulated-gate field-effect transistor previously described in FIGURES 1 and 2. There is shown the gate electrode G, the drain electrode D, the source electrode S, and the substrate of semiconductor material $S_u$. It should be noted that electrodes D and S operate as the drain and the source electrodes as a function of the polarity of the bias potential applied therebetween; i.e., the electrode to which a positive bias potential is applied (relative to the bias potential applied to the other electrode) operates as a drain electrode, and the other electrode operates as a source electrode.

The drain and source electrodes are connected to each other by a conductive channel C. The majority current carriers (in this case electrons) flow from source to drain in this thin channel region close to the surface. The conductive channel C is shown in FIGURE 2 in dotted lines.

Figure 4:
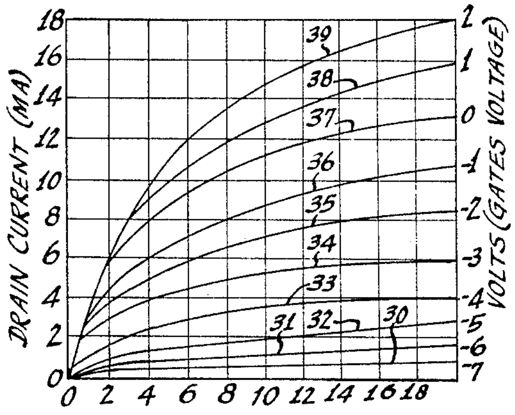
FIGURE 4 is a graph showing a family of drain current versus drain voltage curves, for various values of gate-to-source voltages for the transistor of FIGURE 1.

FIGURE 4 is a family of curves 30–39 illustrating the drain current versus drain voltage characteristic of the transistor of FIGURE 1 for different values of gate-to-source voltage. A feature of an insulated-gate field-effect transistor is that the zero bias characteristic can be at any of the curves 30–39. In FIGURE 4 the curve 37 corresponds to the zero bias gate-to-source voltage. Curves 38 and 39 represent positive gate voltages relative to the source and the curves 30–36 represent negative gate voltages relative to the source.

The location of the zero bias curve is established during the manufacture of the transistor, i.e., by controlling the doping of the channel C and the time or the temperature, or both, during the step of the process in which the silicon dioxide layer 28 shown in FIGURES 1 and 2 is grown.

The transistor shown in FIGURE 1 is known as a depletion type transistor and it includes an inversion layer that corresponds to the channel C shown in FIGURE 2. Another type transistor, an enhancement type transistor, has drain voltage-drain current characteristics similar to the voltage-current characteristics shown in FIGURE 4, but the zero gate-to-source voltage curve corresponds to the curve 30 shown in FIGURE 4. The surface of a P-type silicon wafer, as described in connection with FIGURE 1, has a tendency to convert to N-type during normal transistor processing operations. In order to make an enhancement type transistor, the final surface must remain P-type after the transistor is completed. This may be done, for example, by diffusing a thin layer or boron into the channel surface of the P-type silicon wafer. Part of the boron is later removed by diffusion into the wafer and passed by absorption into an oxide layer on the surface, but enough boron is kept after the processing is completed in order to maintain a P-type surface.

Figure 5:
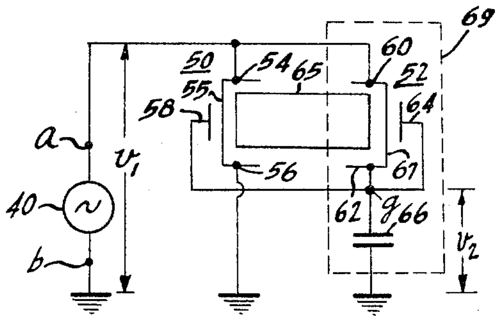
FIGURE 5 is a schematic circuit diagram of a signal translating circuit embodying the invention.

Reference is now made to FIGURE 5, which is a schematic circuit diagram of a signal translating circuit embodying the invention. An alternating current (A.C.) signal source 40 is coupled between signal input terminals *a* and *b*. Input terminal *b* is connected to a point of reference potential shown as ground. A field-effect transistor 50, which is similar to the transistor shown in FIGURES 1 and 2, and which has drain, source and gate electrodes 54, 56 and 58, is connected between the signal input terminals *a* and *b* so that its drain-source current path 55 is coupled across the signal source 40.

Another field-effect transistor 52, which may be similar to the field-effect transistor 50, has its drain, source and gate electrodes 60, 62 and 64 formed on a substrate of semiconductor material 65 which is common to that of the field-effect transistor 50. The drain-source current path 67 of transistor 52 (which exhibits a resistance R) is serially connected with a capacitor 66 to provide a phase shifting network 69. The series circuit 69 is also connected between the input terminals *a* and *b*. The gate electrodes 58 and 64 of field-effect transistors 50 and 52 are respectively connected to the junction of the capacitor 66 and the drain-source current path 67. Although the necessary resistance R for the phase shifting network 69 is shown to be provided by the drain-source current path 67, the required resistance R may be provided by other suitable means, such as a diffused N-type region properly isolated from the rest of the circuit, or an evaporated resistor (over the $SiO_2$), for example. However, using an insulated-gate field-effect transistor in the phase shifting network provides the advantage that a larger dynamic resistance range is obtained, and a great simplification in the manufacturing process because the resistor and the active device may be manufactured simultaneously.

Although both transistors 50 and 52 may be depletion type transistors, as mentioned above, the transistor 52 could be an enhancement type transistor which would result in improved operation of the circuit because of the larger resistance associated with this type transistor. The transistor 50, however, should be a depletion type unit because of the higher transconductance, and hence gain, inherent with a depletion type transistor.

In operation, a signal voltage $V_1$ is applied across the drain-source current path 55 of transistor 50 and across the phase shifting network 69. The drain-source current path 67 of the field-effect transistor 52 exhibits a resistance R corresponding to its zero gate-to-source bias voltage characteristic so that the voltage $V_2$ developed across the capacitor 66 is out-of-phase with the input signal voltage $V_1$. This voltage $V_2$, developed across the capacitor 66, is applied to the gate electrode 58 of the transistor 50. The voltage $V_2$ modulates the resistance exhibited by the drain-source current path 55. Because the voltage $V_2$ is out-of-phase with respect to the signal voltage $V_1$, the current flowing through the drain-source current path 55 (substantially in phase with $V_2$) provides a net current flow from the signal source 40 that is out-of-phase with the input signal voltage $V_1$ by an angle that may approximate 90 degrees. The current flowing from the signal source 40 lags the signal voltage $V_1$ so that the circuit including the transistors 50 and 52 behaves in a manner similar to that of an inductor.

Although the active elements shown in FIGURE 5 are described as insulated-gate field-effect transistors, other types of semiconductor devices, such as bipolar transistors or unipolar field-effect transistors, for example, may be employed. However, the relatively small input impedance associated with bipolar transistors may be undesirable for the present application.

Figure 6:
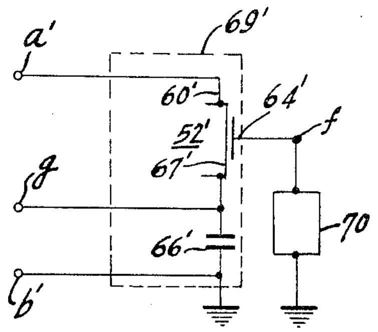
FIGURE 6 is a schematic circuit diagram of another version of a phase shifting network shown in FIGURE 5.

Reference is now made to FIGURE 6 which is a schematic circuit diagram of another version of the phase shifting network 69 shown in FIGURE 5. Primed numerals are employed to indicate elements previously illustrated in FIGURE 5. The phase shifting network 69' includes a transistor 52' similar to the transistor 52 as shown in FIGURE 5. The gate electrode 64' of transistor 52', however, is connected to a variable control voltage source 70 which may be a battery for example, or any other appropriate voltage source. The control voltage source is connected between the gate electrode 52' at a terminal *f* and ground. The terminal *f* may be external to the circuit, or in the case in which the control voltage is derived from another transistor formed in the same semiconductor chip, for example, the connection between the control source 70 and the gate electrode 64' could be internally made. The terminals *a'*, *b'* and *g'* correspond respectively to the terminals *a*, *b* and *g*, shown in FIGURE 5, terminal *g* being the connection between the source electrode 62 of transistor 52 and the gate electrode 58 of transistor 50, also shown in FIGURE 5.

The control voltage applied to the gate electrode 64' of the transistor 52' determines the resistance exhibited by the channel (source-drain current path) 67', as shown in FIGURE 4. The value of inductance exhibited by the circuit is a direct function of the value of resistance exhibited by the source-drain current path 67' ($L \cong CR/g_m$ where C is the capacitance of capacitor 66', $g_m$ is the transconductance of transistor 50, and R is the resistance exhibited by the source-drain current path 67'). By varying the voltage applied to the gate electrode 64' and hence the resistance R is a variable electronic inductor is thereby provided.

Figure 7:
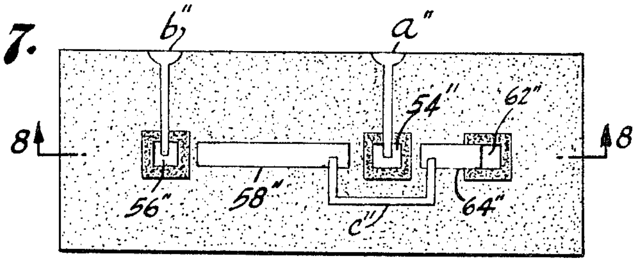
FIGURE 7 is a diagrammatic plan view of the signal translating circuit shown in schematic form in FIGURE 5.

Reference is now made to FIGURE 7 which is a diagrammatic view of the signal translating circuit shown in schematic form in FIGURE 5.

As shown in FIGURE 7, the terminals *a''* and *b''* correspond to the terminals *a* and *b* of the circuit shown in FIGURE 5. The electrode 56″ corresponds to the source electrode 56 of the transsistor 50, and the electrode 58″ corresponds to the gate electrode 58 of the transistor 50. The electrode 54″ in turn corresponds to both drain electrodes 54 and 60 of transistors 50 and 52 respectively. The electrode 62″ corresponds to the source electrode 62 and the electrode 64″ corresponds to the gate electrode 64 of the field-effect transistor 52. The electrode 58″ and 62″ are connected to each other by an external metallic connection *c*″.

Figure 8:
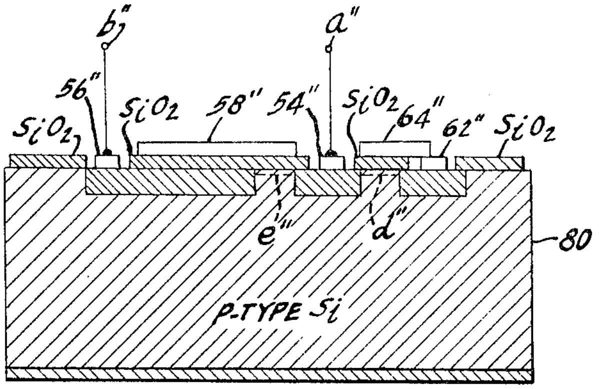
FIGURE 8 is a cross-sectional view taken along section line 8—8 of FIGURE 7.

Reference is now made also to FIGURE 8 of the drawings which is a cross sectional view taken along cross section line 8—8 of FIGURE 7. The body 80 of semiconductor material may be, nearly intrinsic silicon, for example, lightly doped P-type silicon of 100 ohm-cm. material. Heavily doped silicon dioxide is deposited over the surface of the bdoy 80. The silicon dioxide is doped with N-type impurities. The manufacturing process described in connection with the transistor shown in FIGURE 1, or any other suitable process may be utilized to manufacture the circuit shown in FIGURES 7 and 8.

As apparent from FIGURE 7, however, the gate electrode 64″ and the source electrode 62″ may be connected together during the evaporation step described in connection with FIGURE 1. As long as the drain electrode 54″ and hence the drain region is common to both transistors 50 and 52 (shown in FIGURE 5) only one terminal *a*″ is necessary to apply input signals to both transistors. The current path *d*″ (FIGURE 8) may be designed to remain P-type thereby providing an enhancement type insulated-gate field-effect transistor (which exhibits a high channel resistance) by an extra step in the manufacturing process as described in connection with FIGURE 4. The current path *d*″ hence provides the required high resistance for the phase shifting network 69 shown in FIGURE 5. The current path *e*″ is an inversion layer which provides the large transconductance ($g_m$) characteristic required for the desired operation of the circuit. The capacitance corresponding to the capacitor 66 shown in FIGURE 5, is provided between the electrodes 58″ and 56″, which act as the plates of the capacitor, and which are respectively insulated from each other by the silicon dioxide therein between.

Figure 9:
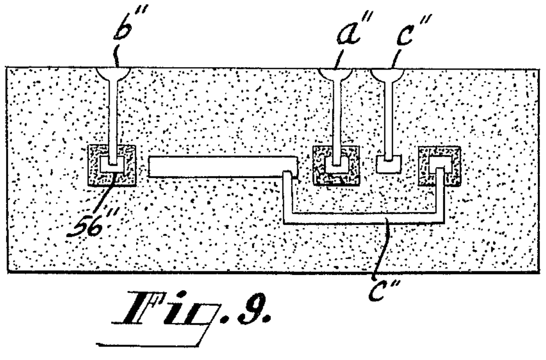
FIGURE 9 is a diagrammatic view of a signal translating circuit similar to the one shown in FIGURE 7 having the phase shifting network schematically illustrated in FIGURE 6.

Reference is now made to FIGURE 9 of the drawings which is a diagrammatic view of an integrated circuit similar to the circuit shown in FIGURE 7, but incorporating the phase shifting network illustrated schematically in FIGURE 6 to provide a variable electronic inductor. The differences between the circuits shown in FIGURES 7 and 9 are: (1) The external connection *c*″ in the circuit shown in FIGURE 9 is made between the gate electrode 58″ and the source electrode 62″ directly; the gate electrode 64″ not being connected to the source electrode 62″, and (2) an external terminal *f*″ is provided to the gate electrode 64″ to apply a control voltage to determine the inductance exhibited by the circuit, as explained in connection with the circuit shown in FIGURE 6.

What is claimed is:

1. An integrated circuit comprising in combination:
a semiconductor device having input, common and control electrodes formed on a substrate of semiconductor material;
a pair of input terminals for applying an input signal voltage $V_1$,
a phase shifting network formed on said substrate and connected between said input terminals for deriving a voltage $V_2$ having a phase angle $\theta$ with respect to said input voltage $V_1$, said phase shifting network including resistive circuit means and capacitive circuit means,
means for connecting said input and common electrodes to said pair of input terminals, and
circuit means coupled to said control electrode for applying said voltage $V_2$ so that the net current flowing through said input terminals lags said input voltage $V_1$.

2. An integrated electrical circuit comprising in combination:
a body of semiconductor material having a first type conductivity,
means formed in said body to provide regions having a second type conductivity opposite from the conductivity of said body, said regions respectively forming a transistor and a resistor,
means formed on said regions providing input, common and control electrodes for said transistor,
a pair of terminals connected to said input and common electrodes for applying an input signal voltage,
a phase-shift network including said resistor and capacitive means intrinsically connected to said resistor for deriving a voltage having a phase angle with respect to said input signal voltage, and
coupling means for applying said voltage derived from said phase-shift network to said control electrode so that the impedance looking into said input terminals is inductive.

3. An electronic inductive circuit comprising in combination:
first and second field-effect transistors each having gate, source and drain electrodes formed on a common substrate of semiconductor material, said first and second transistors having a common drain electrode, and each having a drain-source current path exhibiting a resistance as a function of the voltage applied between said gate and source electrodes;
a pair of input terminals each respectively connected to said drain electrode and to said source electrode of said first transistor for applying an input signal voltage;
means for connecting said gate electrode of said first transistor to said source electrode of said second transistor;
capacitive circuit means formed between said gate and source electrodes of said first transistor of said substrate of semiconductor material; and
means for providing a control voltage between said gate and source electrodes of said second transistor to determine the resistance exhibited by said drain-source current path of said second transistor.

4. An integrated circuit comprising in combination:
a transistor having input, common and control electrodes formed on a substrate of semiconductor material,
a pair of external terminals coupled to said input and common electrodes for applying an input signal voltage,
a phase shifting network including voltage-controlled resistive circuit means and capacitive circuit means formed in said substrate of semiconductor material for deriving a voltage out of phase with said input signal voltage, said resistive means being coupled between said input and control electrodes, said capacitive means being coupled between said control and common electrodes, said integrated circuit exhibiting the characteristics of an inductor as a function of the capacitance and resistance respectively exhibited by said capacitive and resistive circuit means, and
circuit means coupled to said resistive circuit means for applying a control voltage to control the resistance exhibited by said resistive circuit means and hence to control the inductance exhibited by said integrated circuit.

5. An integrated electrical circuit comprising in combination:
a body of semiconductor material having a first type conductivity,
means formed in said body to provide regions having a second type conductivity opposite from the conductivity of said body, said regions being coupled by conductive channels to form first and second transistors, means formed on said regions providing input, common and control electrodes for said transistors, said first and second transistors having a common input electrode, a pair of terminals connected to said input electrode and to said common electrode of said first transistor for applying an input signal voltage, a phase-shift network coupled in between said pair of terminals including capacitive circuit means formed on said substrate and the conductive channel of said second transistor to derive a voltage out of phase with respect to said input signal voltage, means for coupling said control and common electrodes of said second transistor to each other, and means for applying said out of phase voltage to said control electrode of said first transistor so that the net current flowing into said pair of terminals lags said input signal voltage.

6. An integrated circuit comprising in combination:

a field-effect transistor having gate, source and drain electrodes formed on a substrate of semiconductor material, and having a drain-source current path exhibiting a resistance as a function of the voltage applied between said gate and source electrodes;

means including a pair of input terminals for applying an input signal voltage;

a phase shifting network including a second field-effect transistor having gate, source and drain electrodes formed on said substrate of semiconductor material, and having a source-drain current path that exhibits a resistance as a function of the gate source voltage, and capacitive means formed in said substrate in series with said source-drain current path, for deriving a voltage which is out-of-phase with said input signal voltage;

said drain electrodes of said first and second transistors constituting a common drain electrode for both transistors;

means for connecting said drain-source current path of said first transistor and said phase shifting network between said said pair of input terminals;

means for connecting said gate electrode of said first transistor to said source electrode of said second transistor to apply said voltage derived from said phase shifting network to said first transistor and thereby derive a current flow through its source-drain current path that lags said input signal voltage; and means coupled between said source electrode of said first transistor and said gate electrode of said second transistor for applying a voltage to control the resistance exhibited by said source-drain current path of said second transistor and thereby control the phase shift of said voltage derived from said phase shift network.

7. An electronic inductive circuit comprising in combination:

first and second field-effect transistors each having gate, source and drain electrodes formed on a common substrate of semiconductor material, and each having a drain-source current path exhibiting a resistance as a function of the voltage applied between the corresponding gate and source electrodes;

first and second input terminals for applying an input signal voltage, said first terminal being connected to said drain electrodes and said second terminal being connected to said source electrode of said first transistor;

means for connecting said gate electrodes to said source electrode of said second transistor; and capacitive circuit means formed between said gate and source electrodes of said first transistor on said substrate of semiconductor material.

References Cited by the Examiner

UNITED STATES PATENTS

| | | | |
|---|---|---|---|
| 3,070,762 | 12/1962 | Evans | 307—88.5 X |
| 3,160,835 | 12/1964 | Christensen | 307—88.5 X |
| 3,165,708 | 1/1965 | Stelmak et al. | 331—108 X |
| 3,170,126 | 2/1965 | Bento et al. | 332—31 X |
| 3,174,112 | 3/1965 | Stelmak | 330—37 X |

ARTHUR GAUSS, *Primary Examiner.*

J. JORDAN, *Assistant Examiner.*